(12) United States Patent
Fan et al.

(10) Patent No.: US 10,304,822 B2
(45) Date of Patent: May 28, 2019

(54) SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Wenjin Fan, Beijing (CN); Lei Zhang, Beijing (CN); Ming Hu, Beijing (CN); Yuhui Lai, Beijing (CN); Qingpu Wang, Beijing (CN); Jun Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 434 days.

(21) Appl. No.: 15/159,236

(22) Filed: May 19, 2016

(65) Prior Publication Data
US 2017/0092639 A1    Mar. 30, 2017

(30) Foreign Application Priority Data
Sep. 24, 2015   (CN) .......................... 2015 1 0618189

(51) Int. Cl.
  *H02H 9/00*   (2006.01)
  *H01L 27/02*  (2006.01)
  *G06F 3/041*  (2006.01)
  *H01L 27/12*  (2006.01)

(52) U.S. Cl.
  CPC ......... *H01L 27/0292* (2013.01); *G06F 3/041* (2013.01); *H01L 27/1244* (2013.01)

(58) Field of Classification Search
  None
  See application file for complete search history.

(56) References Cited

U.S. PATENT DOCUMENTS

2008/0266730 A1\* 10/2008 Viborg ............... H01L 27/0288
                                                      361/56
2013/0293508 A1   11/2013 Lin et al.

FOREIGN PATENT DOCUMENTS

CN             101578006 A     11/2009

OTHER PUBLICATIONS

Office Action dated Sep. 15, 2017 issued Chinese Application No. 201510618189.5.

\* cited by examiner

*Primary Examiner* — Stephen W Jackson
(74) *Attorney, Agent, or Firm* — Nath, Goldberg & Meyer; Joshua B. Goldberg

(57) ABSTRACT

The present disclosure provides a substrate and a display device. The substrate includes an internal region and a peripheral region surrounding the internal region, a plurality of signal wires and at least one ground wire being included in the peripheral region; any two adjacent signal wires, as well as the signal wire and the ground wire which are adjacent to each other, are connected through a selective connection structure; and the selective connection structure is capable of being connected in case of electro-static discharge. In the substrate and the display device provided by the present disclosure, because static electricity in each signal channel inside the substrate can be finally discharged via the ground wire in case of ESD, ESD protection for each signal channel in the internal region and the signal wire connected thereto can be achieved.

16 Claims, 2 Drawing Sheets

SUBSTRATE AND DISPLAY DEVICE

CROSS-REFERENCE TO RELATED APPLICATION

This application claims priority to Chinese Patent Application No. 201510618189.5, filed on Sep. 24, 2015, the contents of which are incorporated by reference in the entirety.

FIELD OF THE INVENTION

The present invention relates to the field of display technology, and in particular to a substrate and a display device.

BACKGROUND OF THE INVENTION

At present, touch panel and display panel have been very commonly used. In general, a touch panel (or display panel) includes an internal touch region (or display region) and a peripheral region surrounding the internal touch region (or display region). The peripheral region includes multiple types of signal wires therein, one end of each signal wire is connected to a corresponding element in the touch region (display region), the other end thereof is connected to a driving circuit for providing various driving signals, and the signal wires are used for providing various driving signals to the elements in the touch region (display region).

During the manufacture and use of the touch panel and the display panel, electro-static discharge (ESD) may occur, and if static electricity in the touch panel or display panel cannot be discharged from the panel quickly and effectively, ESD damage may be caused to the panel.

FIG. 1 is a schematic structure diagram of a touch substrate in the prior art; and FIG. 2 is a schematic diagram of a wiring structure of a touch substrate in the prior art. As shown in FIGS. 1 and 2, the touch substrate in the prior art includes a touch region 1 and a peripheral region 2. Signal wires 4 each having one end connected to a signal channel 3 in the touch region and the other end connected to one of various driving circuits (not shown in figures) are included in the peripheral region 2. The signal wires 4 are used for inputting or outputting signals. Ground wire 5 arranged at the periphery of the peripheral region 2 is also included in the peripheral region 2. ESD produced in a touch substrate in the prior art can only be dissipated, in the form of heat, through the signal channels 3 in the touch region 1 and the signal wires 4 in the peripheral region 2, and thus cannot be led out smoothly. No ESD protection structure is provided between adjacent signal channels 3, so the signal channels 3 in the entire touch region 1 cannot be protected from ESD. Generally, when ESD is higher than 2 KV, damage may be caused to the signal channels 3 in the touch region 1 and the signal wires 4 in the peripheral region 2.

SUMMARY OF THE INVENTION

The technical solutions adopted to solve the above problem include a substrate and a display device.

The present disclosure provides a substrate, including an internal region and a peripheral region surrounding the internal region, a plurality of signal wires and at least one ground wire are included in the peripheral region, any two adjacent signal wires, as well as the signal wire and the ground wire which are adjacent to each other, are connected through a selective connection structure; and the selective connection structure is capable of being connected in case of electro-static discharge.

Optionally, one end of each signal wire is connected to a corresponding signal channel in the internal region, and the other end thereof is connected to a corresponding driving circuit.

Optionally, the selective connection structure includes two tip portions which are oppositely arranged and spaced apart from each other by a predetermined distance.

Optionally, the predetermined distance is in the range of 5 μm to 10 μm.

Optionally, the predetermined distance is in the range of 6 μm to 8 μm.

Optionally, the two tip portions are arranged symmetrically relative to a midperpendicular of a segment connecting between apexes of the two tip portions.

Optionally, each tip portion is shaped like an isosceles triangle; vertex angles of the two isosceles triangles are arranged oppositely.

Optionally, the vertex angle is in the range of 15° to 60°.

Optionally, a plurality of signal wires and one ground wire are included in the peripheral region; and the plurality of signal wires and the one ground wire are sequentially arranged along a direction from the inside to the outside of the peripheral region.

Optionally, the selective connection structure is connected in case of electro-static discharge, and disconnected without electro-static discharge.

Optionally, the substrate is a touch substrate or an array substrate.

The present disclosure further provides a display device, which includes the above substrate.

In the substrate and the display device provided by the present disclosure, because static electricity in each signal channel inside the substrate can be finally discharged via the ground wire in case of ESD, ESD protection for each signal channel in the internal region and the signal wire connected thereto can be achieved.

Figure 1:
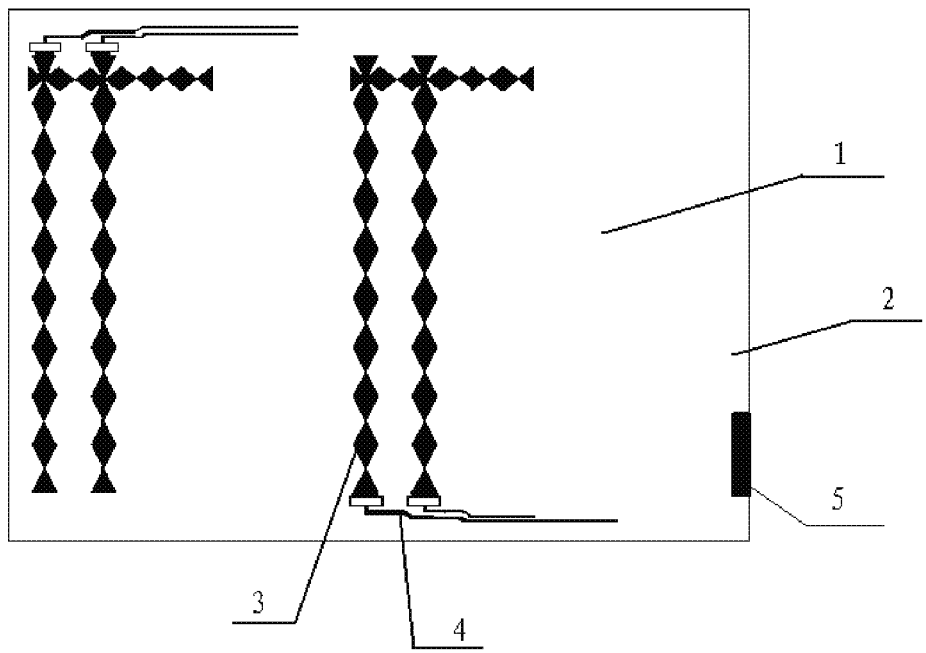
FIG. 1 is a schematic structure diagram of a touch substrate in the prior art.
Figure 2:
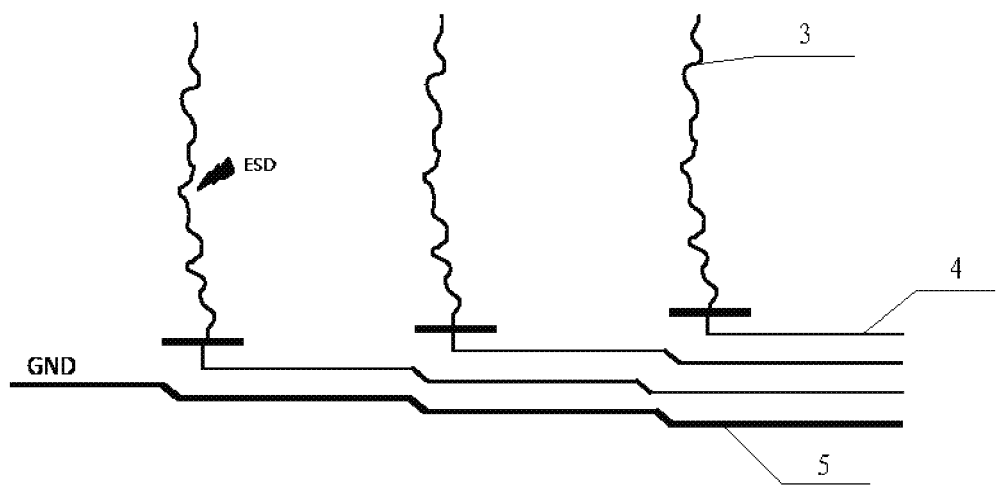
FIG. 2 is a schematic diagram of a wiring structure of a touch substrate in the prior art.

REFERENCE NUMERALS 1. touch region; 2. peripheral region; 3. signal channel; 4. signal wire; 5. ground wire; 6. selective connection structure; 61. tip portion; α: apex angle of tip portion; d: predetermined distance between two opposite tip portions.

DETAILED DESCRIPTION OF THE EMBODIMENTS

To provide a better understanding of technical solutions of the present disclosure for those skilled in the art, the present invention will be further described in detail below in conjunction with the accompanying drawings and specific implementations.

Figure 3:
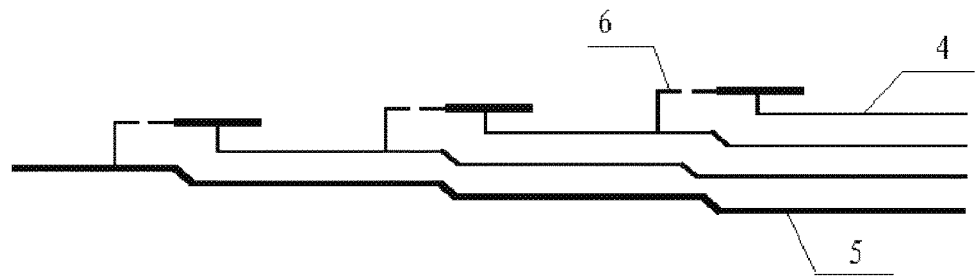
FIG. 3 is a schematic diagram of a wiring structure of a touch substrate according to an embodiment of the present invention.

FIG. 3 is a schematic diagram of a wiring structure of a touch substrate according to embodiments of the present invention. As shown in FIG. 3, embodiments of the present invention provide a substrate, which includes an internal region and a peripheral region surrounding the internal region. A plurality of signal wires 4 and at least one ground wire 5 are included in the peripheral region; one end of each signal wire 4 is connected to a corresponding signal channel in the internal region, and the other end thereof is connected to a corresponding driving circuit; any two adjacent signal wires 4, as well as the signal wire 4 and the ground wire 5 which are adjacent to each other, are connected through a selective connection structure 6; the selective connection structure 6 can be connected in case of ESD.

According to the substrate provided by the embodiments of the present invention, because static electricity in each signal channel inside the substrate can be finally discharged via the ground wire in case of ESD, ESD protection for each signal channel in the internal region and the signal wire 4 connected thereto can be achieved.

The process of leading out ESD in the above substrate will be described below by taking the case where the above substrate is a touch substrate as an example. In this case, the internal region is specifically a touch region of the touch substrate.

Figure 4:
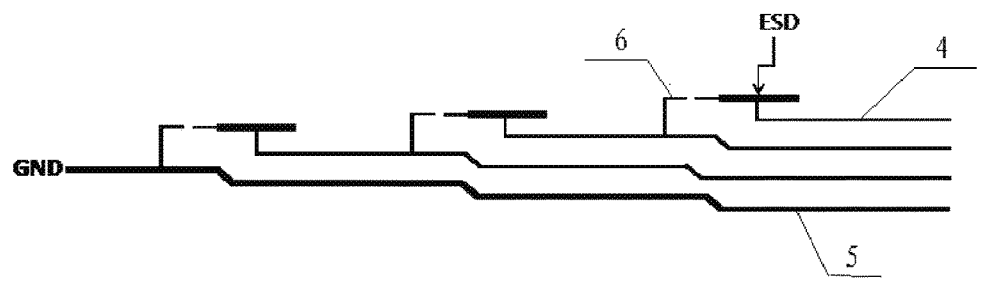
FIG. 4 is a schematic diagram illustrating a process of leading out electro-static discharge in a touch substrate according to an embodiment of the present invention.

FIG. 4 is a schematic diagram illustrating a process of leading out ESD in a touch substrate according to an embodiment of the present invention. As shown in FIG. 4, in the case that ESD occurs in any signal channel 3 in the touch region, static electricity is transferred to a signal wire 4 adjacent to the signal wire 4 connected to the signal channel 3 through a selective connection structure 6 on the signal wire 4 connected to the signal channel 3, then transferred sequentially, and finally transferred to the ground wire 5 to be led out. In this way, static electricity in all the channels in both the touch region and the peripheral region can be discharged.

Figure 5:
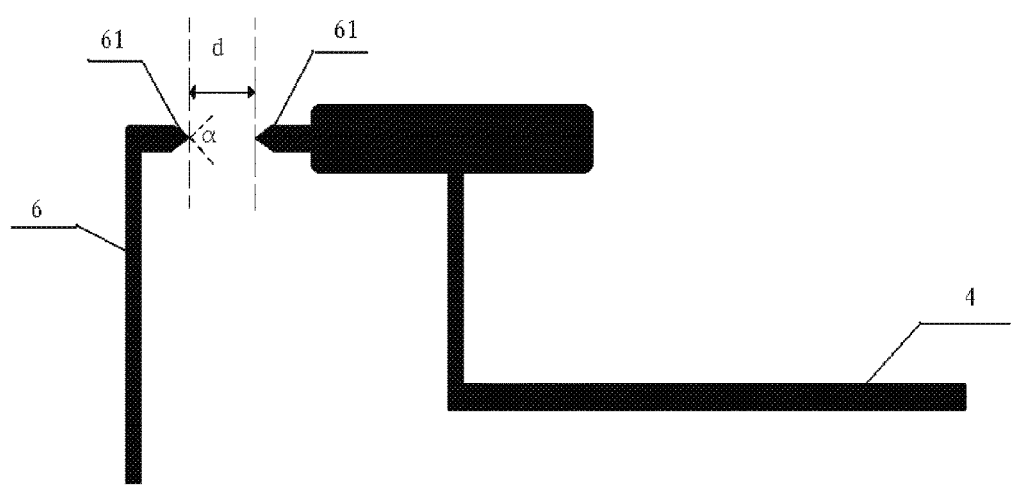
FIG. 5 is a schematic structure diagram of a selective connection structure according to an embodiment of the present invention.

FIG. 5 is a schematic structure diagram of a selective connection structure according to an embodiment of the present invention. As shown in FIG. 5, the selective connection structure 6 includes two tip portions 61 which are oppositely arranged and spaced apart from each other by a predetermined distance.

The selective connection structure 6 including two tip portions 61 which are oppositely arranged and spaced apart from each other by a predetermined distance d allows two adjacent signal wires 4 corresponding thereto, as well as one signal wire 4 and one ground wire 5 adjacent to each other and corresponding thereto, to be connected only in case of ESD, but to be disconnected from each other at other times (without ESD), thereby ensuring normal operation of the respective signal channels and the respective signal wires 4.

Optionally, the predetermined distance d is in the range of 5 μm to 10 μm.

With the predetermined distance d set in the above range, not only the case that adjacent signal wires 4 are connected to influence each other when transferring normal operating signals, due to a too small predetermined distance between the tip portions 6, but also the case that static electricity cannot be discharged in the event of ESD due to a too large predetermined distance between the tip portions 6 can be avoided.

Optionally, the predetermined distance d is in the range of 6 μm to 8 μm. Such a range can ensure smooth discharge of static electricity produced in a general touch substrate or display substrate.

Optionally, the two tip portions 61 are arranged symmetrically relative to a midperpendicular of a segment connecting between apexes of the two tip portions 61. It should be understood that such arrangement can better utilize point discharge effect and is conducive to conduction of static electricity.

Optionally, each tip portion 61 is shaped like an isosceles triangle; vertex angles of the two isosceles triangles are arranged oppositely.

It should be understood that, in consideration of actual effect of static electricity discharge and for ease of manufacture, the two oppositely arranged tip portions 61 may be shaped like isosceles triangles, in this case, vertex angles α of the two isosceles triangles are arranged oppositely, and the base of each isosceles triangle is configured to be connected to the signal wire 4 or the ground wire 5 corresponding thereto.

Optionally, the vertex angle α of the isosceles triangle is in the range of 15° to 60°, which can better utilize point discharge effect and is conducive to conduction of static electricity.

In the example shown in FIG. 4, a plurality of signal wires 4 and one ground wire 5 are included in the peripheral region; the plurality of signal wires 4 and the one ground wire 5 are sequentially arranged along a direction from the inside (a side close to the internal region) to the outside (a side away from the internal region) of the peripheral region, that is, the plurality of signal wires 4 are sequentially arranged from the inside to the outside at one side of the ground wire 5 close to the internal region.

It should be understood that, there may be a plurality of above ground wires 5; and the signal wire 4 may be led out from one or more of the four sides of the substrate, which is not limited herein.

It should be understood that, the substrate may include a touch substrate or an array substrate. Description is given above by taking the case that the substrate is a touch substrate as an example, but the substrate provided by the embodiments of present invention may also serve as an array substrate if channel signals are changed, which will not be described herein.

Embodiments of the present invention provide a display device, which includes the above substrate.

The display device may be any product or component with a display function, such as electronic paper, a mobile phone, a tablet computer, a television, a monitor, a notebook computer, a digital photo frame, a navigator or the like.

Because the display device provided by the embodiments of the present invention includes the above substrate, and static electricity in each signal channel inside the substrate can be finally discharged via the ground wire in case of ESD, ESD protection for each signal channel and the signal wire connected thereto can be achieved.

It can be understood that, the above implementations are merely exemplary implementations used for explaining the principle of the present invention, but the present invention is not limited thereto. For those skilled in the art, various modifications and improvements may be made without departing from the spirit and essence of the present invention, and these modifications and improvements are also deemed as falling within the protection scope of the present invention.

The invention claimed is:

1. A substrate, comprising an internal region and a peripheral region surrounding the internal region, a plurality of signal wires and at least one ground wire being included in the peripheral region, wherein, any two adjacent signal wires, as well as the signal wire and the ground wire which are adjacent to each other, are connected through a selective connection structure, and the selective connection structure is capable of being connected in case of electro-static discharge, and wherein the selective connection structure comprises two tip portions which are oppositely arranged and spaced apart from each other by a predetermined distance, and the predetermined distance is in the range of 5 μm to 10 μm.

2. The substrate according to claim 1, wherein, the predetermined distance is in the range of 6 μm to 8 μm.

3. The substrate according to claim 1, wherein, the two tip portions are arranged symmetrically relative to a midperpendicular of a segment connecting between apexes of the two tip portions.

4. The substrate according to claim 3, wherein, each tip portion is shaped like an isosceles triangle; and vertex angles of the two isosceles triangles are arranged oppositely.

5. The substrate according to claim 4, wherein, the vertex angle is in the range of 15° to 60°.

6. The substrate according to claim 1, wherein, a plurality of signal wires and one ground wire are included in the peripheral region; and the plurality of signal wires and the one ground wire are sequentially arranged along a direction from the inside to the outside of the peripheral region.

7. The substrate according to claim 1, wherein, one end of each signal wire is connected to a corresponding signal channel in the internal region, and the other end thereof is connected to a corresponding driving circuit.

8. The substrate according to claim 1, wherein, the selective connection structure is connected in case of electro-static discharge, and disconnected without electro-static discharge.

9. The substrate according to claim 1, wherein, the substrate is a touch substrate or an array substrate.

10. A display device, comprising a substrate, wherein, the substrate comprises an internal region and a peripheral region surrounding the internal region, a plurality of signal wires and at least one ground wire are included in the peripheral region; any two adjacent signal wires, as well as the signal wire and the ground wire which are adjacent to each other, are connected through a selective connection structure; and the selective connection structure is capable of being connected in case of electro-static discharge, and wherein the selective connection structure comprises two tip portions which are oppositely arranged and spaced apart from each other by a predetermined distance, and the predetermined distance is in the range of 5 μm to 10 μm.

11. The display device according to claim 10, wherein, the predetermined distance is in the range of 6 μm to 8 μm.

12. The display device according to claim 10, wherein, the two tip portions are arranged symmetrically relative to a midperpendicular of a segment connecting between apexes of the two tip portions.

13. The display device according to claim 12, wherein, each tip portion is shaped like an isosceles triangle; vertex angles of the two isosceles triangles are arranged oppositely.

14. The display device according to claim 13, wherein, the vertex angle is in the range of 15° to 60°.

15. The display device according to claim 10, wherein, a plurality of signal wires and one ground wire are included in the peripheral region; and the plurality of signal wires and the one ground wire are sequentially arranged along a direction from the inside to the outside of the peripheral region.

16. The display device according to claim 10, wherein, the selective connection structure is connected in case of electro-static discharge, and disconnected without electro-static discharge.

* * * * *